United States Patent
Oh et al.

(10) Patent No.: US 7,704,828 B2
(45) Date of Patent: Apr. 27, 2010

(54) METHOD OF FABRICATING A SEMICONDUCTOR DEVICE

(75) Inventors: Jung-Min Oh, Incheon (KR);
Jeong-Nam Han, Seoul (KR);
Chang-Ki Hong, Gyeonggi-do (KR);
Kun-Tack Lee, Gyeonggi-do (KR);
Dae-Hyuk Kang, Gyeonggi-do (KR);
Sung-Il Cho, Seoul (KR)

(73) Assignee: Samsung Electronics Co., Ltd.,
Yeongtong-gu, Suwon-si, Gyeonggi-do (KR)

( * ) Notice: Subject to any disclaimer, the term of this patent is extended or adjusted under 35 U.S.C. 154(b) by 391 days.

(21) Appl. No.: 11/741,639

(22) Filed: Apr. 27, 2007

(65) Prior Publication Data
US 2007/0254389 A1 Nov. 1, 2007

(30) Foreign Application Priority Data
May 1, 2006 (KR) ............. 10-2006-0039292

(51) Int. Cl.
*H01L 21/8242* (2006.01)
(52) U.S. Cl. ............... 438/254; 257/E21.008
(58) Field of Classification Search ......... 438/253–254, 438/386, 387, 396, 397; 257/E21.008
See application file for complete search history.

(56) References Cited

U.S. PATENT DOCUMENTS 5,863,821 A * 1/1999 Chao ................ 438/253
2002/0197817 A1* 12/2002 Bok et al. ............. 438/397
2003/0075753 A1* 4/2003 Chu et al. ............. 257/308

FOREIGN PATENT DOCUMENTS

| KR | 2001-0005235 | 1/2001 |
|----|--------------|--------|
| KR | 2002-0057698 | 7/2002 |
| KR | 2003-0001828 | 1/2003 |
| KR | 2003-0024211 | 3/2003 |
| KR | 2003-0067821 | 8/2003 |
| KR | 2005-0007939 | 1/2005 |

OTHER PUBLICATIONS

English language abstract of Korean Publication No. 2001-0005235.
English language abstract of Korean Publication No. 2003-0001828.
English language abstract of Korean Publication No. 2003-0067821.
English language abstract of Korean Publication No. 2005-0007939.

* cited by examiner

*Primary Examiner*—David A Zarneke
*Assistant Examiner*—Jenny L Wagner
(74) *Attorney, Agent, or Firm*—Muir Patent Consulting, PLLC

(57) ABSTRACT

A method of fabricating a semiconductor device is provided. The method includes forming a mold for forming a storage electrode, forming sacrificial spacers at side walls of openings in the mold, forming a conductive film for a storage electrode along the inside of the openings, removing the mold by a wet etching process, removing the sacrificial spacers by a dry etching process, and sequentially forming a dielectric film and an upper electrode on the storage electrode.

26 Claims, 11 Drawing Sheets

METHOD OF FABRICATING A SEMICONDUCTOR DEVICE

CROSS REFERENCE TO RELATED APPLICATION

This application claims priority under 35 USC § 119 to Korean Patent Application No. 10-2006-0039292, filed on May 1, 2006 in the Korean Intellectual Property Office, the contents of which are incorporated herein by reference in their entirety.

BACKGROUND

1. Technical Field

This disclosure relates to a method of fabricating a semiconductor device and, more particularly, to a method of fabricating a cylinder-type capacitor.

2. Description of the Related Art

Recently, as semiconductor devices have become more highly integrated, design rules for fabricating the semiconductor devices have decreased. As a result, the regions available for forming capacitors are also being decreased. Generally, the capacitance of a capacitor is proportional to the dielectric constant of the dielectric film and the surface area of the electrodes. It is desirable to fabricate a capacitor with high capacitance in order to provide reliable data storage between refresh cycles in the semiconductor device. Thus, in order to form a capacitor having high capacitance in a narrow area, the dielectric film should be formed of a material having high dielectric constant (i.e. a high-k material), or the surface area of the electrodes should be increased. However, introducing high-K materials into existing manufacturing processes presents problems like requiring new manufacturing equipment, presenting reliability concerns of the dielectric films, and the feasibility of mass-production. Therefore, in order to ensure adequate capacitance required for highly integrated semiconductor devices with conventional dielectric films, it is necessary to increase the surface area of the electrodes.

Therefore, recently, the demand for capacitors having a cylinder-type storage electrode which has increased height and small intervals between nodes, that is, a cylinder-type storage electrode with a large aspect ratio, is increasing.

A method of forming a conventional cylinder-type capacitor is described below.

The method comprises forming an etch stop film on an interlayer insulating film including contact plugs and then forming an insulating film for a mold with a height in accordance with the desired height of the storage electrode for the cylinder-type capacitor. Next, the insulating film and the etch stop film are sequentially etched to complete a mold defining an opening which exposes the contact plugs. Finally, conductive polysilicon is deposited in the opening, the electrodes are separated by cells to form the cylinder-type storage electrode, and then the mold is removed by a wet etching process.

In the meantime, water may remain between the storage electrodes when the mold is removed by wet etching. Since water has high surface tension, leaning may occur between storage electrodes, forming a bridge therebetween during the subsequent wet and dry etching processes. Due to this leaning phenomenon, which causes the storage electrodes to be bridged, the characteristics of semiconductor devices are often deteriorated. As the aspect ratio increases, the leaning occurs more frequently.

In addition, during the wet etching process for removing the mold, etchant may permeate into the interface between the storage electrode and the etch stop film. Thus, defects may occur in a lower membrane under the etch stop film.

Therefore, the demand for cylinder-type capacitors having a large aspect ratio, low occurrence of bridging between the electrodes, and low membrane defects, is increasing.

The invention addresses these and other disadvantages of the conventional art.

SUMMARY

The invention provides a method of fabricating a semiconductor device having a large aspect ratio, in which a leaning phenomenon between adjacent storage electrodes can be suppressed to prevent the forming of a bridge therebetween and in which lower structure defects can be reduced.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art to which the invention belongs. Like reference numerals refer to like elements throughout the specification.

The invention will be described with reference to cross-sectional views, in which preferred embodiments of the invention are shown. Thus, the profile of an exemplary view may be modified according to manufacturing techniques and/or allowances. That is, the described embodiments of the invention are not intended to limit the scope of the present invention but instead, the invention includes all changes and modifications that can be caused due to tolerances in the manufacturing processes. For example, while an etched region is shown in a rectangular shape in the drawings, it may be rounded or have a predetermined curvature in practice. Thus, regions shown in the drawings are illustrated in schematic form and the shapes of the regions are presented simply by way of illustration and not as a limitation. In addition, in each drawing, the size of each layer and region and relative sizes may be exaggerated for clarity.

Hereinafter, a method of fabricating a semiconductor device according to an embodiment of the invention will be described with reference to FIGS. 1A to 1K. FIGS. 1A to 1K are cross-sectional views showing the method of fabricating a semiconductor device according to the embodiment of the invention.

Figure 1A:
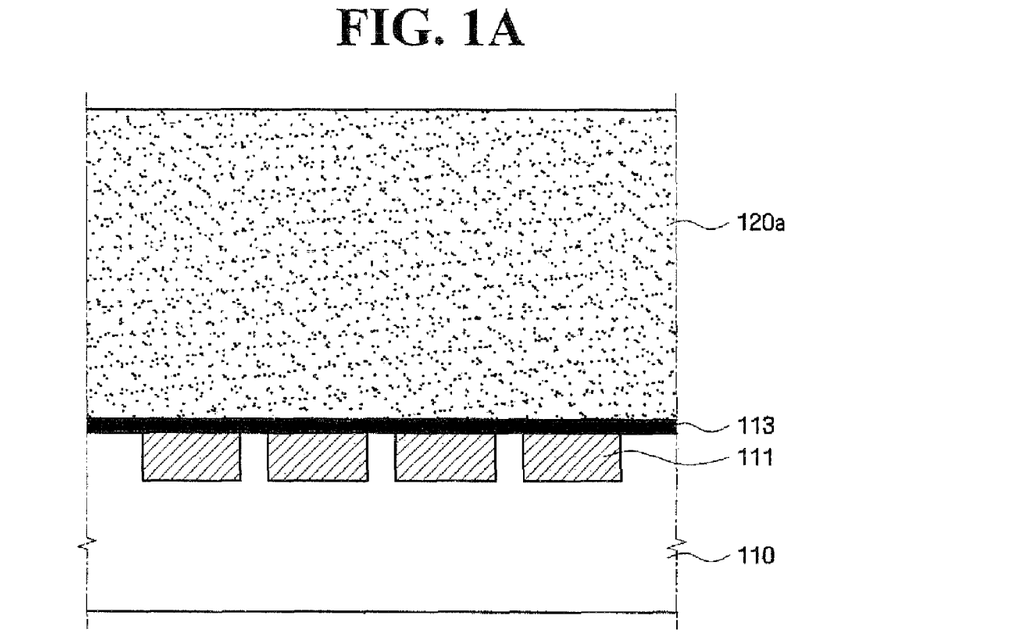
FIGS. 1A to 1K are cross-sectional views showing a method of fabricating a semiconductor device according to an embodiment of the present invention.

Referring to FIG. 1A, an interlayer insulating film 110 including contact plugs 111 is first formed on a substrate (not shown).

The substrate may be a substrate formed of more than one semiconductor material selected from a group composed of Si, Ge, SiGe, GaP, GaAs, SiC, SiGeC, InAs and InP, an SOI (Silicon On Insulator) substrate or the like. However, these are presented as examples only.

A process for forming the interlayer insulating film 110 and contact plugs 111 on the substrate can be performed by a general method known in the art. Although not shown in the drawing, various kinds of active and passive elements or wiring lines may be formed under the contact plugs 111.

Next, an etch stop film 113 is formed to cover the interlayer insulating film 110 and the contact plugs 111, and then a mold insulating film 120a is formed. In this case, the etch stop film 113 is formed to terminate etching during a subsequent process in which the mold insulating film 120a is etched, and it can be formed of materials having different etching selection ratio from that of the mold insulating film 120a. For example, the etch stop film 113 may comprise a silicon nitride film when the mold insulating film 120a comprises silicon oxide film systems. The interlayer insulating film 110 and the mold insulating film 120a may comprise silicon oxide film systems, and the silicon oxide film systems may include an oxide film doped with impurities or an oxide film that is not doped with impurities. For example, the oxide film doped with impurities may be BPSG (Boron Phosphorus Silicate Glass) or PSG (Phosphorus Silicate Glass), but it is not limited thereto. In addition, the oxide film that is not doped with impurities may be, for example, a PE-TEOS (Plasma Enhanced Tetra Ethyl Ortho Silicate), HDP (High Density Plasma) oxide film or a P—$SiH_4$ oxide film, but it is not limited thereto.

Although not specifically shown in FIG. 1, the interlayer insulating film 110 and the mold insulating film 120a may be provided as a single film of one material or a complex film in which various materials are laminated.

Figure 1B:
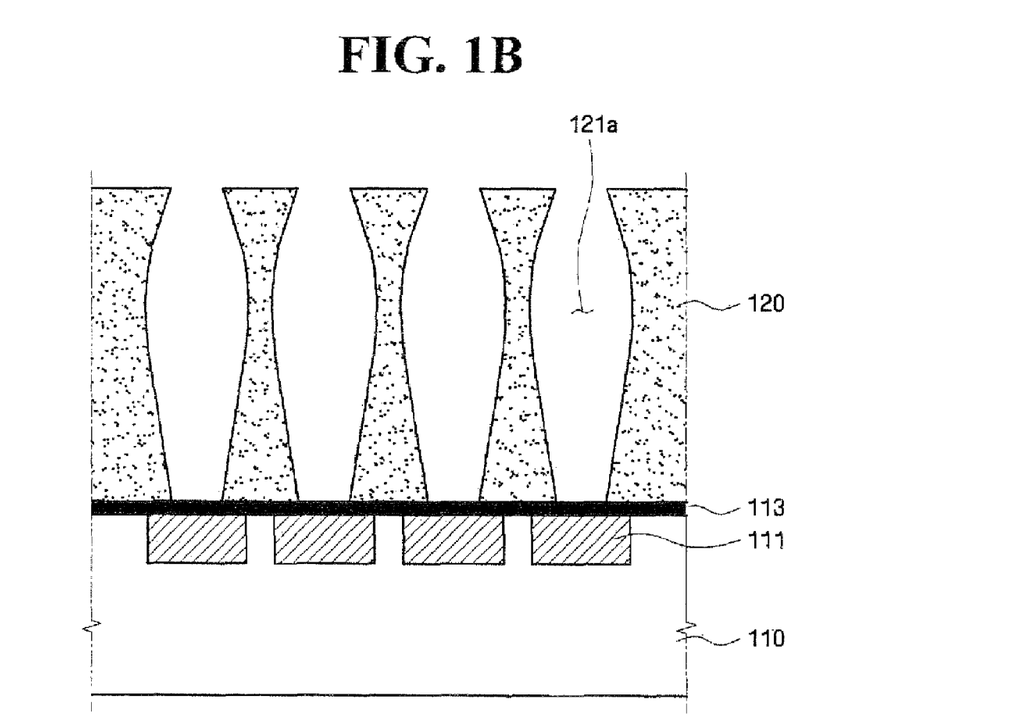
Figure 1C:
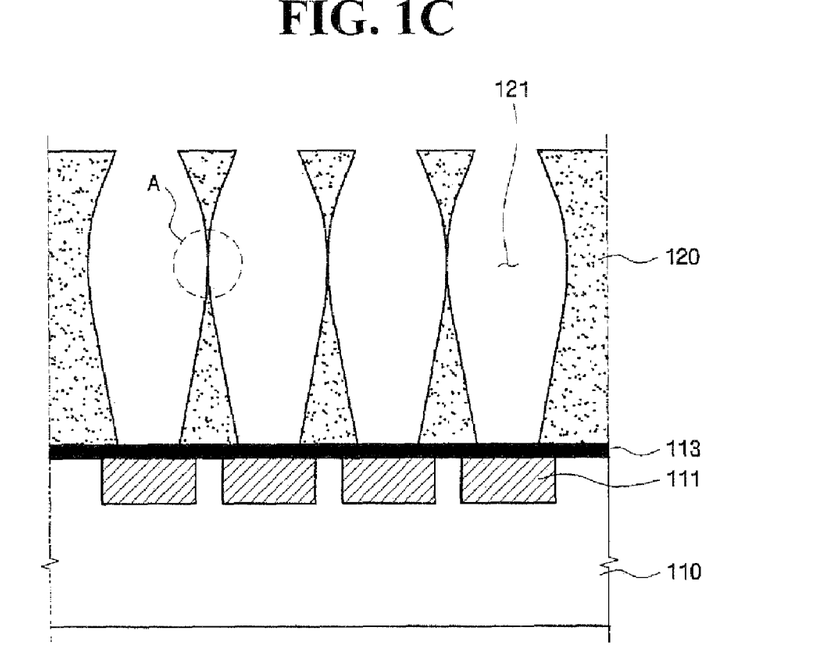

Next, referring to FIG. 1B and FIG. 1C, openings are formed through the mold insulating film 120a on the interlayer insulating film 110. Accordingly, a mold 120 for forming a storage electrode can be formed.

To be more specific, as shown in FIG. 1B, openings 121a are formed through the mold insulating film 120a. In this case, the openings 121a may be formed by an anisotropic dry etching process. The anisotropic dry etching process may use, for example, an etching gas of $CF_X$ systems such as $C_4F_6$ and $C_3F_8$, but the etching gas is not limited thereto. The etching may stop on the etch stop film 113.

In this case an expanded area may be formed on the side walls of the opening 121a by a bowing phenomenon due to the etching gas. The bowing phenomenon means that an upper end of the opening expands due to reflection and diffusion of etching gas during an etching process to form an opening having a high aspect ratio as the thickness of the mold insulating film 120a increases. The bowing phenomenon may lead adjacent openings to meet each other.

Afterwards, as shown in FIG. 1C, the opening may be expanded further.

In this case, the expansion of the opening 121 may be caused by an isotropic etching process. For example, the isotropic etching process may be a wet etching process using hydrofluoric acid, an APM (ammonium peroxide mixture) like SC-1 ($NH_4OH+H_2O_2$ +deionized water), or BOE (buffered oxide etchant) including a $HF/NH_4F$ mixture. The opening 121 formed inside the mold 120 is an area for forming a storage electrode of a cylinder-type capacitor. As a result of this expansion process, the area of a capacitor storage electrode to be formed by a subsequent process can be further expanded. In addition, it is possible to decrease the so-called leaning phenomenon in which storage electrodes collapse, by enlarging the width of a lower end of the opening 121.

The openings 121 formed inside the mold 120 may form contact regions A where adjacent openings meet each other. Even though the openings 121 may be formed to meet each other, it is possible to ensure an insulating region between adjacent storage electrodes by forming a sacrificial spacer thereafter, thus, a short circuit phenomenon does not occur between storage electrodes. Therefore, it is unnecessary to closely adjust the process conditions in an attempt to prevent the short circuit phenomenon while forming the openings in the mold insulating film 120a or expanding the formed openings. Further, there are benefits in that the openings can be maximally expanded so as to increase the surface area of the storage electrodes of the cylinder-type capacitor.

In addition, when the contact regions A are formed between the openings 121, sacrificial spacers, to be described below, may be formed to meet other adjacent sacrificial spacers. In other words, when adjacent openings 121 meet to form contact regions A, a sacrificial spacer formed in a subsequent process may contact another adjacent sacrificial spacer. The formation of the sacrificial spacers will be described in greater detail below.

Figure 1D:
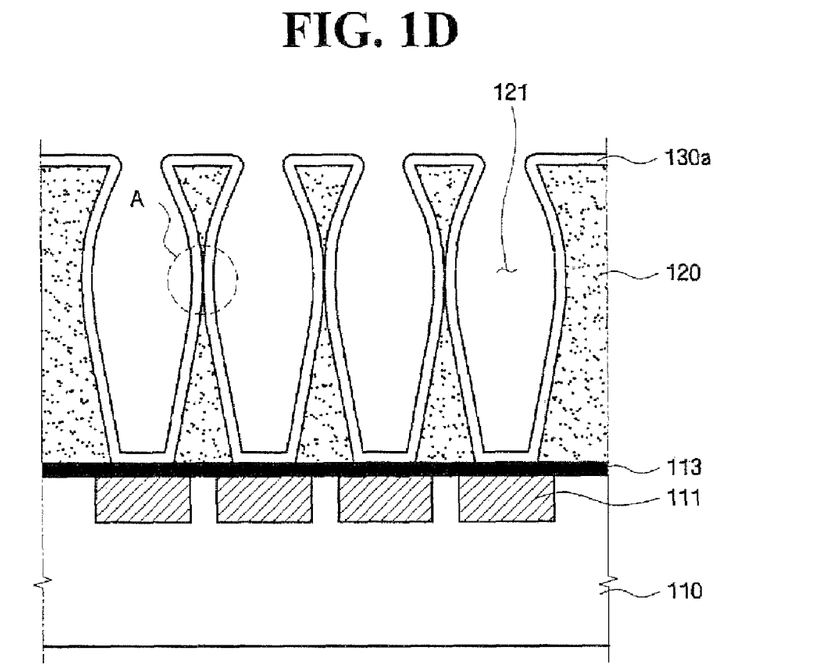
Figure 1E:
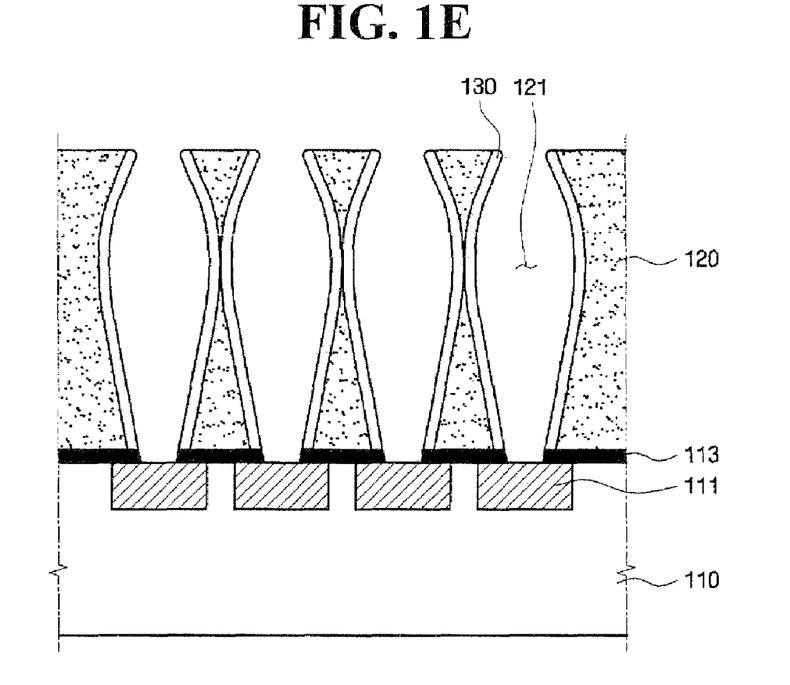

Next, referring to FIG. 1D and FIG. 1E, sacrificial spacers 130 are formed at side walls of the openings 121.

As shown in FIG. 1D, an insulating film 130a is conformally formed along the inside of the opening 121. In this case, the insulating film 130a preferably uses materials having different etching selectivity from that of the mold 120 and that of a sacrificial capping film to be described below. In other words, the insulating film 130a should be formed of a material that is capable of withstanding the wet etching removal process of the mold 120 and the sacrificial capping film. For example, taking into account the desired etching selectivity ratio with the mold 120, the insulating film 130a may include insulating polysilicon, silicon nitride material, and amorphous carbon (ACL), but it is not limited thereto. The insulating film 130a can be formed by general deposition methods, such as chemical vapor deposition (CVD) and atomic layer deposition (ALD).

Subsequently, as shown in FIG. 1E, the insulating film (130a of FIG. 1D) disposed on the top surface of the mold 120 and on the bottom surface of the opening 121 is removed. The insulating film may be removed by using an etching-back process, or the like, to complete the formation of the sacrificial spacer 130.

Next, by removing the exposed etch stop film 113 on the bottom surface of the opening 121, the surface of the contact plugs 111, formed under the opening 121, can be exposed. According to the present embodiment, to expose the top surface of the contact plugs 111, the removal of the etch stop film 113 can be performed after forming the sacrificial spacer 130. However, the invention is not limited thereto, and the removal can be performed in any step as long as the step precedes the formation of the conductive film for the storage electrode.

It is possible to adjust intervals between storage electrodes to be described below by varying the thickness of the sacrificial spacer 130. In this respect, the thickness of the sacrificial spacer 130 may be in the range of 150 to 300 Å, but it is not limited thereto. Changes and modifications are allowed within the scope of the invention.

Subsequently, referring to FIG. 1F, a conductive film 140a for the storage electrode is conformally formed along the inside of the opening 121 in which the sacrificial spacer 130 is formed. In this case, the conductive film 140a meets the exposed top surface of the contact plugs 111.

The conductive film 140a may be formed of a single film or a complex film including materials such as Ru, Ir, Ti, TiN or conductive polysilicon, but it is not limited thereto. The conductive film 140a can be formed by general deposition methods such as CVD, ALD, and physical vapor deposition (PVD). In this case, preferably, the sacrificial spacer 130 and the conductive film 140a use materials having etching selectivity with respect to each other. For example, when the sacrificial spacer 130 is formed of an insulating polysilicon material, the conductive film 140a is preferably made of materials other than insulating polysilicon.

Figure 1F:
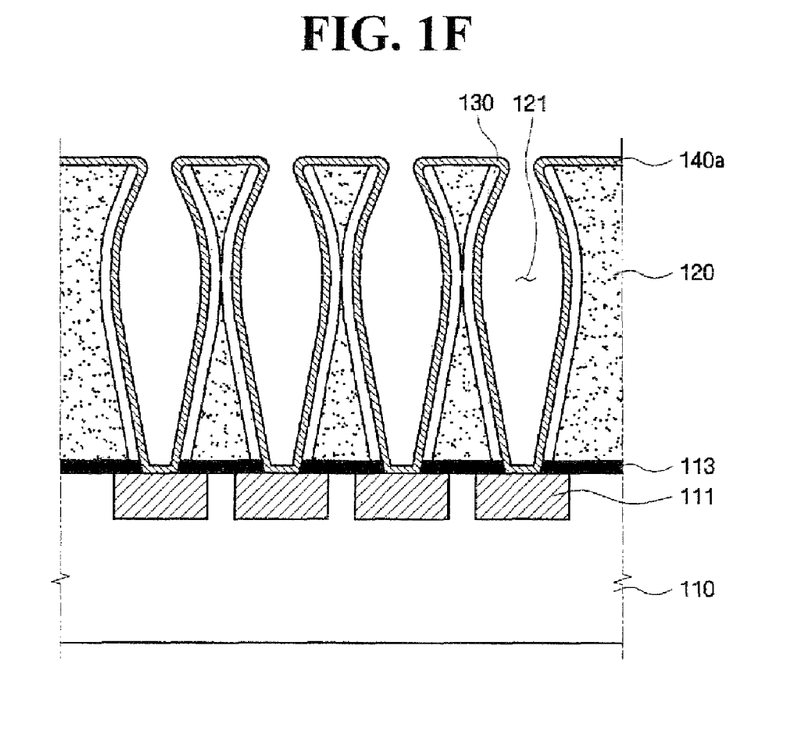
Figure 1G:
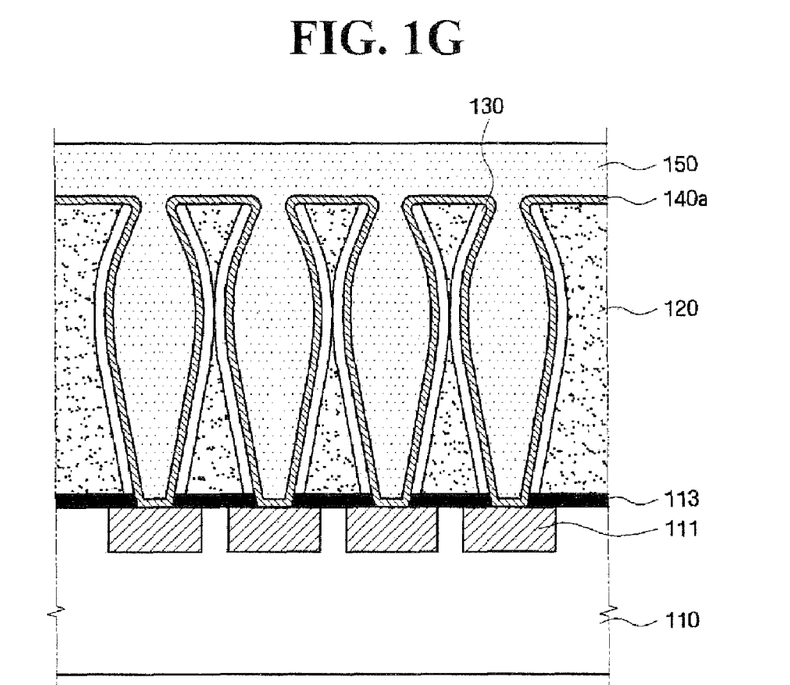

Next, referring to FIG. 1G, a sacrificial capping film 150 fills the inside of the opening (121 of FIG. 1F) and has an upper surface that is higher than the mold 120.

The sacrificial capping film 150 may be an insulating film having superior gap-feeling characteristics. For example, BPSG, PSG, USG (Undoped Silicate Glass), and an oxide membrane like an ALD oxide film (Atomic Layer Deposition oxide) can be used, but it is not limited thereto.

Figure 1H:
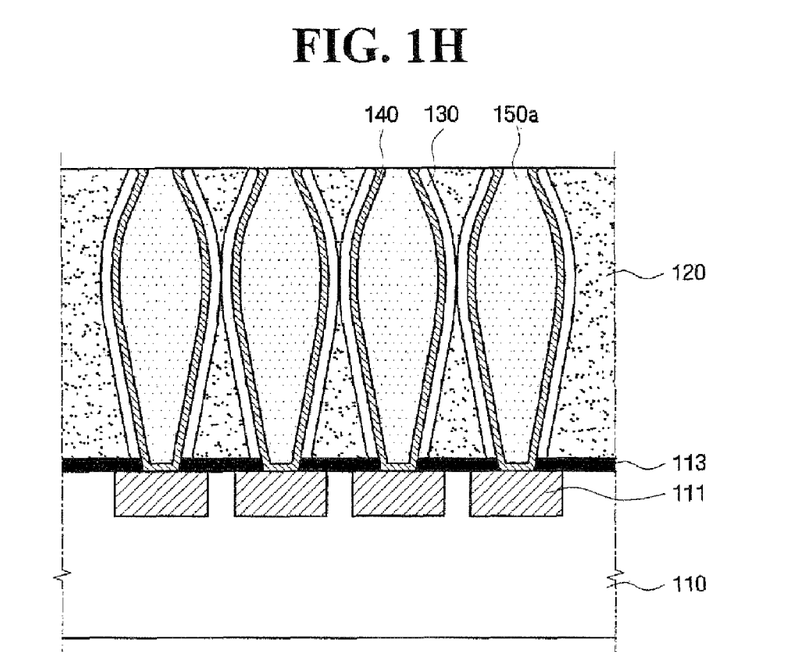

Subsequently, referring to FIG. 1H, the sacrificial capping film (150 of FIG. 1G) and the conductive film (140a of FIG. 1G) are partially removed to complete the formation of the node-separated storage electrode 140.

In this case, the partial removal of the sacrificial capping film 150 and the conductive film 140a can be performed by a CMP (chemical mechanical polishing) process or a dry etching process, and the upper part of the mold 120 can be exposed by the removal.

Figure 1I:
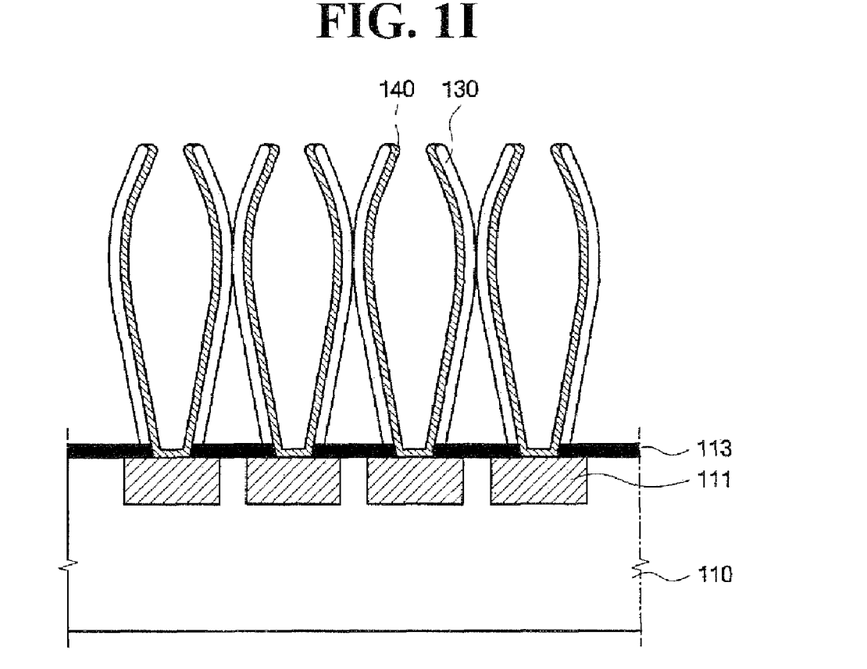

Next, as shown in FIG. 1I, the mold (120 of FIG. 1H) and the sacrificial capping film (150a of FIG. 1H) are removed by a wet etching process. The wet etching process may include, for example, using hydrofluoric acid or BOE including an HF/NH$_4$F mixture, but it is not limited thereto. After the wet etching process, a general drying process is performed.

In this case, while the mold (120 of FIG. 1 H) and the sacrificial capping film (150a of FIG. 1H) can be removed at the same time by a wet etching process, the sacrificial spacer 130 is not removed and still remains at the external wall of the storage electrode 140 so as to support the storage electrode 140. In this way, according to the embodiment of the invention, the mold 120 and the sacrificial capping film 150a are removed by a wet etching process, but the sacrificial spacer 130 supports the storage electrode 140. Therefore, unlike the conventional art, the collapse of storage electrodes can be minimized.

Further, the sacrificial spacer 130 may reduce the effects of the wet etching process on a lower structure, for example, the interlayer insulating film 110 or the contact plugs 111. Etching liquid may penetrate into the lower structures under the etch stop film 113 through the interface of the storage electrode 140 and the etch stop film 113. However, because the travel path of the etching liquid into the lower structures under the etch stop film 113 is lengthened as much as the thickness of the sacrificial spacer 130, defects in the lower structures can be reduced.

In addition, as shown in FIG. 1I, in a case in which the sacrificial spacer 130 is connected to other adjacent sacrificial spacers, the adjacent sacrificial spacers 130 support each other, thus, during the removal process of the mold and the sacrificial capping film, the collapse of the storage electrode 140 is reliably prevented. Therefore, when the sacrificial spacers 130 are connected to each other, the storage electrode 140 may be more effectively supported.

As described above, according to the embodiment of the invention, the collapse of the storage electrode may be minimized during the removal of the mold and the sacrificial capping film. Thus, defects can be decreased.

Figure 1J:
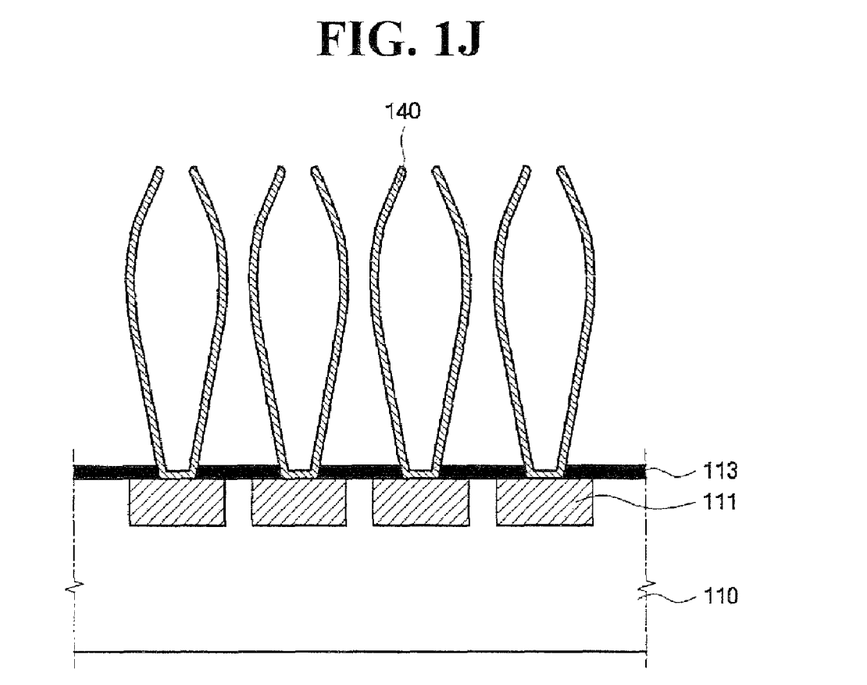

Subsequently, referring to FIG. 1J, the sacrificial spacer (130 of FIG. 1I) is removed by a dry removal process. As the sacrificial spacer (130 of FIG. 1i) is removed by the dry removal process, the external walls of the storage electrodes 140 are exposed.

As described above, according to the embodiment of the invention, the complete exposure of the external wall of the storage electrodes 140 is not performed by a wet etching process but instead by a dry removal process, which prevents the occurrence of the leaning phenomenon, which can be caused by the surface tension of water. Generally, the leaning phenomenon occurs during a wet etching process. By using the dry removal process, the leaning phenomenon of the storage electrode 140 can be prevented.

The dry removal process can be performed by an ashing or a dry etching process. For example, in a case in which the sacrificial spacer (130 of FIG. 1I) is formed of amorphous carbon material, the dry removal process can be performed by a general oxygen ($O_2$) ashing process. To be more specific, the dry removal process can be performed by using oxygen gas at a temperature in the range of about 100 to 200° C. and at a pressure of below about 10 mTorr, but it is not limited thereto. For example, the ashing process can be performed in an oxygen-free atmosphere like a nitride atmosphere. Further, in a case in which the sacrificial spacer (130 of FIG. 1I) is formed of insulating polysilicon or silicon nitrides, the dry removal process can be performed by an isotropic dry etching. For example, while using $CF_4/O_2$ gas or the like, CDE (chemical dry etch) using remote plasma can be performed at a temperature of about 70° C. and at a pressure in the range of about 75 to 675 about mTorr.

Figure 1K:
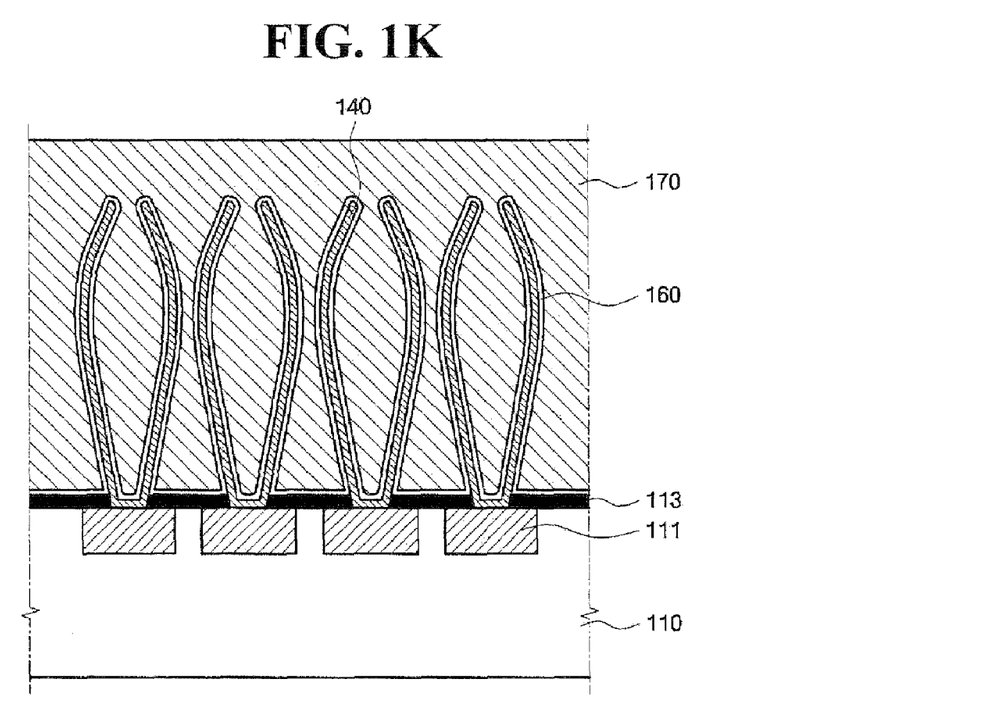

Next, referring to FIG. 1K, a dielectric film 160 and an upper electrode 170 are sequentially formed on the storage electrode 140, so as to complete a cylinder-type capacitor. The formation of the dielectric film 160 and the upper electrode 170 can be performed by general methods, such as CVD, ALD and PVD.

In this case, the dielectric film 160 can be formed as a single film, for example, a tantalum oxide ($Ta_2O_5$) film or an aluminum oxide ($Al_2O_3$) film, or it can be formed as a laminated film, for example, a tantalum oxide film/titanium oxide film, an aluminum oxide film/titanium oxide film, but it is not limited thereto. In addition, the upper electrode 170 may be formed of the same material as the storage electrode 140 or formed of other conductive materials.

Next, according to process steps well known to those skilled in the art of semiconductor manufacturing, a process of forming wiring lines, a process of forming passivation on the substrate, and a process of packaging the substrate are further performed to complete the formation of the semiconductor device.

Hereinafter, a method of fabricating a semiconductor device according to another embodiment of the invention will be described with reference to FIGS. 2A to 2J. Since most process conditions are performed substantially in the same manner as the process conditions of the previously mentioned embodiment, repeated description will be omitted hereinafter, and differences will be mainly described.

According to the embodiment to be described below, a mold having a multilayer structure can be used for forming a storage electrode. A method of forming an insulating film for a mold with a multilayer structure and a multilayer mold is disclosed in Korean Patent Laid-Open No. 10-2003-0047578 (co-assigned to the assignee of this application), the contents of which are incorporated by reference herein in their entirety.

Figure 2A:
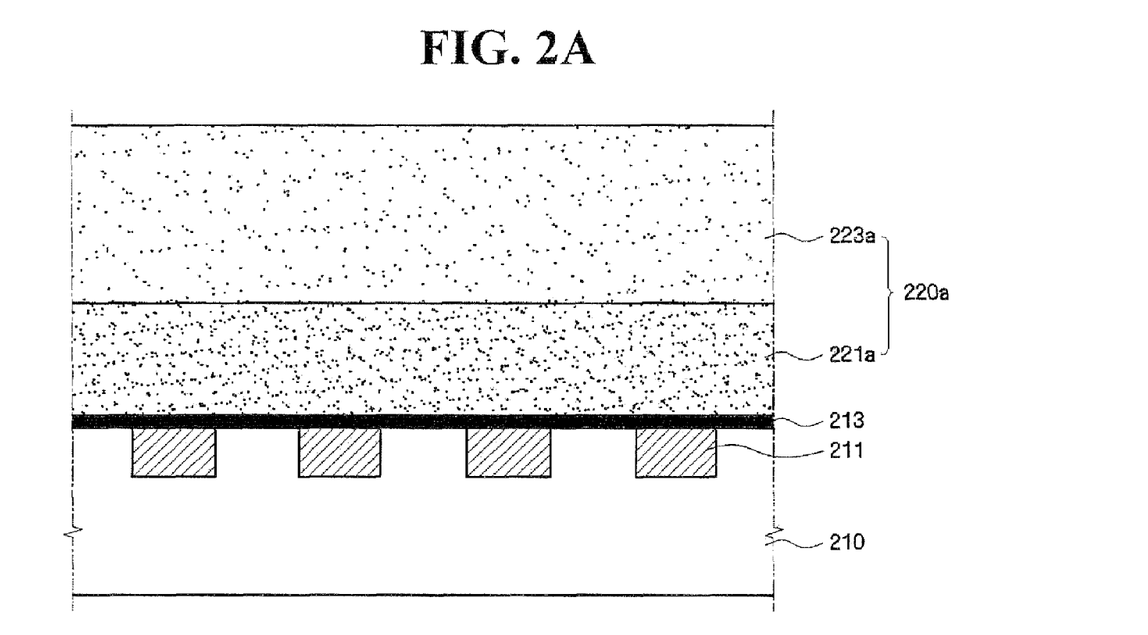
FIGS. 2A to 2J are cross-sectional views showing a method of fabricating a semiconductor device according to another embodiment of the present invention.

First, as shown in FIG. 2A, an interlayer insulating film 210 including a contact plug 211 is formed on a substrate (not shown), and then an insulating film 220a for a multilayer mold is formed on the interlayer insulating film 210.

According to this embodiment, the mold insulating film 220a is formed by laminating a lower insulating film 221a for a lower mold doped with impurities and an upper insulating film 223a for an upper mold that is not doped with impurities on each other. In this case, the lower insulating film 221a may be, for example, an oxide film doped with impurities, that is, BPSG (Boron Phosphorus Silicate Glass) or PSG (Phosphorus Silicate Glass), but it is not limited thereto. The upper insulating film 223a may be, for example, an oxide film that is not doped with impurities, that is, a PE-TEOS (Plasma Enhanced Tetra Ethyl Ortho Silicate), HDP (High Density Plasma) oxide film or P-SiH4 oxide film or the like, but it is not limited thereto.

The impurity concentration of the lower insulating film 221a effects the wet etching rate of the lower insulating film 221a, and the higher the impurity concentration becomes, the larger the etching rate becomes. Therefore, the impurity concentration is adjusted in accordance with a desired wet etching rate. In this way, the etch selectivity of the lower insulating film 221a with respect to the upper insulating film 223a can be controlled.

Figure 2B:
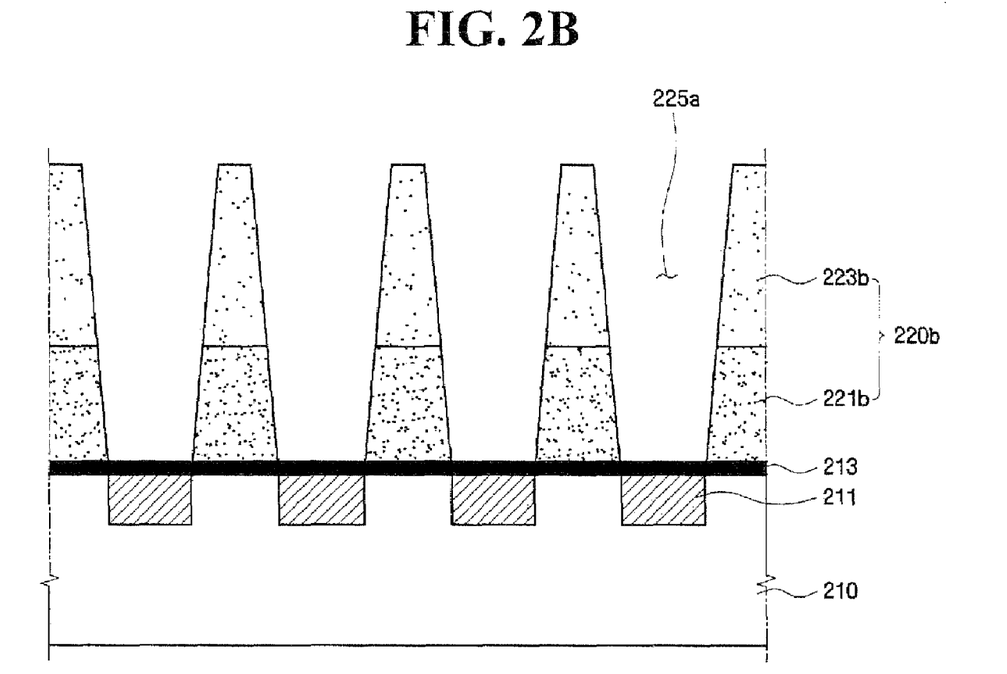

Next, referring to FIG. 2B, a plurality of openings 225a is formed through an insulating film 220b for a multilayer mold.

In this case, the openings 225a can be formed mainly by a dry etching process, and the dry etching process can be performed using etching gas of CFx systems (for example, $C_4F_6$ or $C_3F_8$). The formed openings 225a have a constant incline from top to bottom due to limitations of the dry etching process. In addition, as shown in the previous embodiment, a predetermined bowing phenomenon may occur on the upper end of the openings 225a, but the present embodiment omits showing the occurrence of the bowing phenomenon.

Subsequently, referring to FIG. 2C, formation of a multilayer mold 220 for forming a storage electrode is completed by expanding the openings (225a of FIG. 2B) formed in the mold insulating film (220b of FIG. 2B).

In this case, a lower insulating film (221b of FIG. 2B) for a lower mold doped with impurities has a larger etching rate than an upper insulating film (223b of FIG. 2B) that is not doped with impurities. Therefore, the multilayer mold 220 is formed in a vase shape in which the lower mold 221 is expanded more than the upper mold 223. In the drawing, the multilayer mold is formed as a double mold, but it is not limited thereto, the multilayer mold can be formed to have two layers or more.

Since the width of a lower part of a storage electrode to be formed in a subsequent process can be expanded in the vase-shaped opening 225, the collapse of the storage electrode can be more reliably prevented.

Figure 2C:
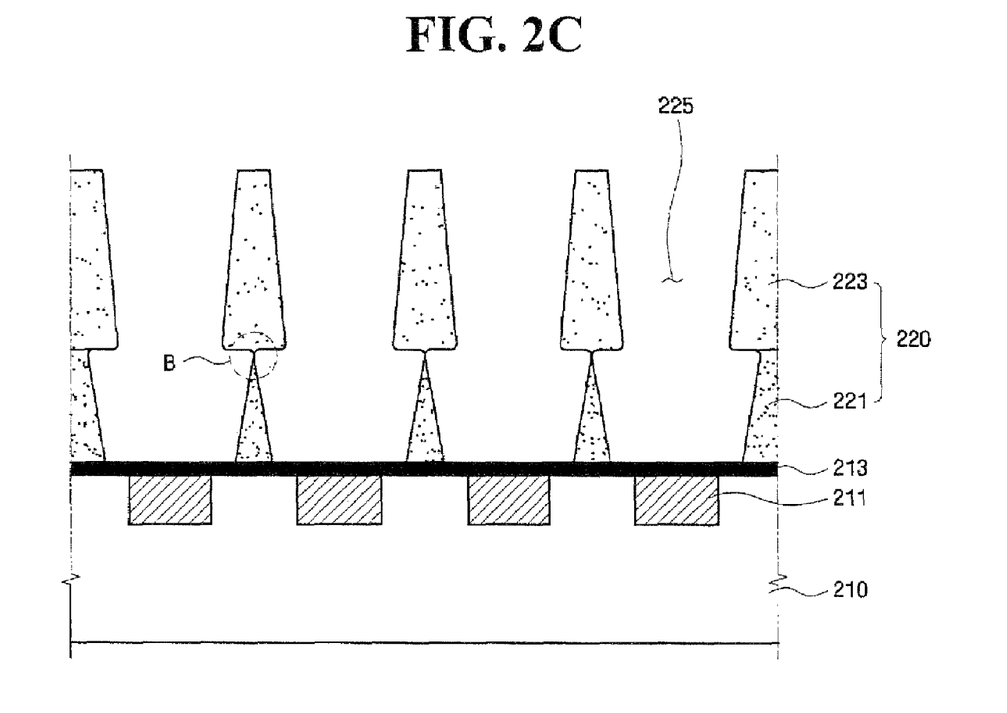

In this case, as shown in FIG. 2C, the expanded openings 225 may form contact regions B where adjacent openings meet each other. Despite the contact regions B, a short circuit in a storage electrode is prevented from occurring, since the storage electrode is formed after forming a sacrificial spacer, that is, an insulating membrane at the side wall of the opening 225 in a subsequent process. Therefore, it is unnecessary to closely adjust etching conditions, taking into consideration the short circuit of a storage electrode formed in a subsequent process. Further, there are benefits of the process of this embodiment in that the opening can be maximally expanded without taking into consideration the short circuits between the storage electrodes. Therefore, the surface area of the storage electrodes can be maximized.

The expansion of the openings 225 can be implemented by a wet etching process using, for example, hydrofluoric acid, APM (ammonium peroxide mixture) like SC-1, or BOE (buffered oxide etchant) including $HF/NH_4F$ mixture. Alternatively, the wet etching process can be performed by sequentially using SC-1 and HF, but it is not limited thereto.

Figure 2D:
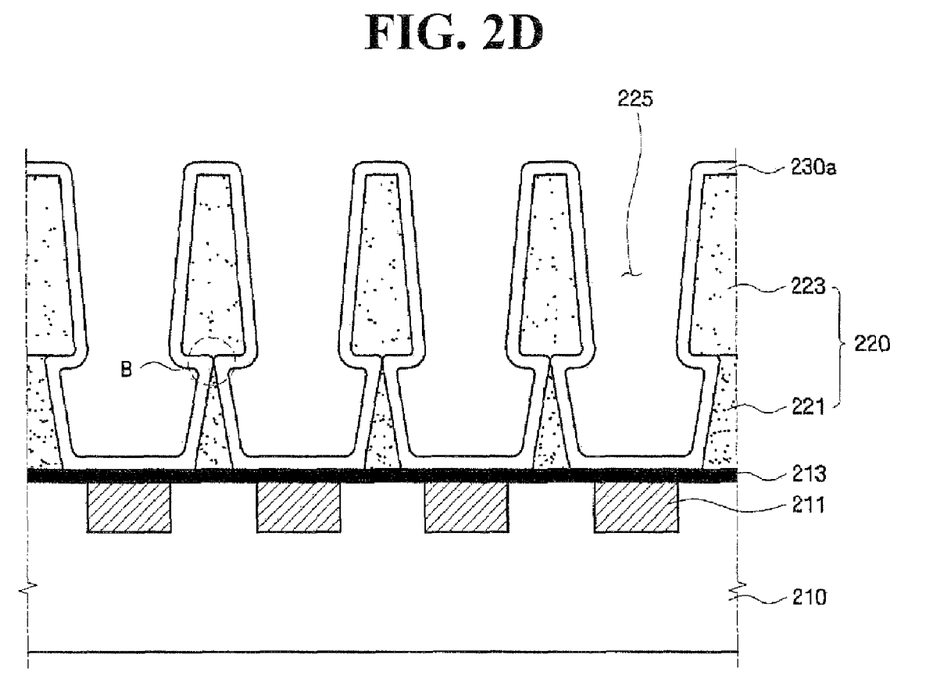
Figure 2E:
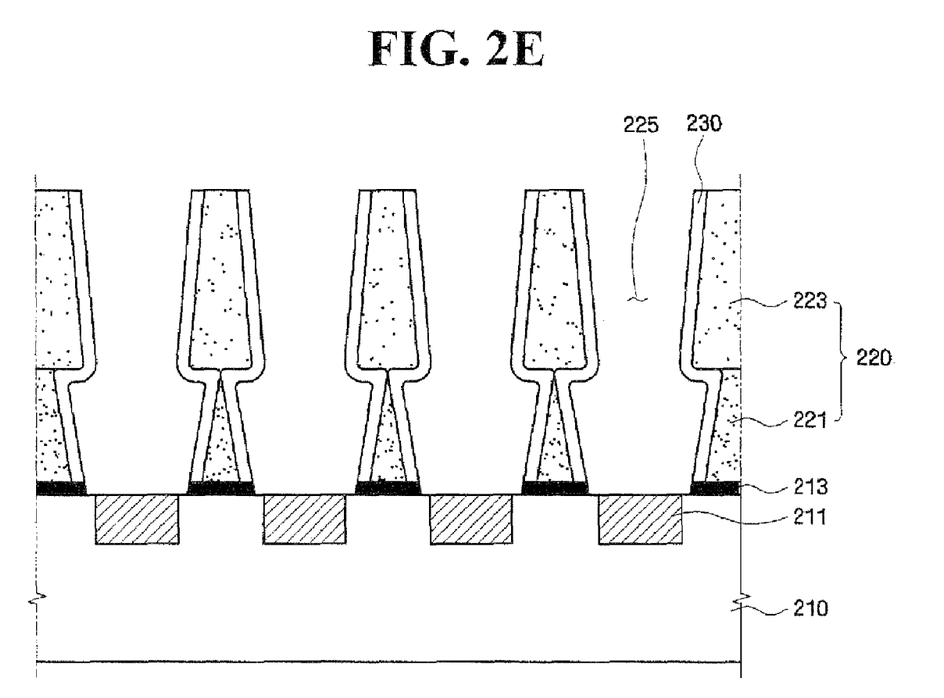

Next, referring to FIG. 2D and FIG. 2E, a sacrificial spacer 230 is formed on the side walls of the opening 225. The sacrificial spacer 230 can be formed in the same or similar manner as that of FIGS. 1D and 1E.

In this case, as shown in the drawing, if the openings 225 are in contact with each other at a lower mold 221, a sacrificial spacer is connected to another adjacent sacrificial spacer in the contact region B so as to support each other.

With the sacrificial spacers 230, intervals between storage electrodes to be described below can be adjusted. In this respect, the thickness of the sacrificial spacer 230 is in the range of 150 to 300 Å, but it is not limited thereto, and it can be modified within the scope of the invention.

Thereafter, the etch stop film 213 is exposed on the bottom surface of the openings 225 by removing a portion of the sacrificial spacer 230 on the bottom surface of the openings 225. The top of the upper mold 223 is also exposed by removing a portion of the sacrificial spacer 230 on the top of the upper mold 223. The top surface of the contact plug 211 is exposed by removing the etch stop film 213 exposed on the bottom surface of the openings 225. The process of exposing the top surface of the contact plug 211 can be performed in any step as long as the step precedes forming of a conductive film for a storage electrode.

Figure 2F:
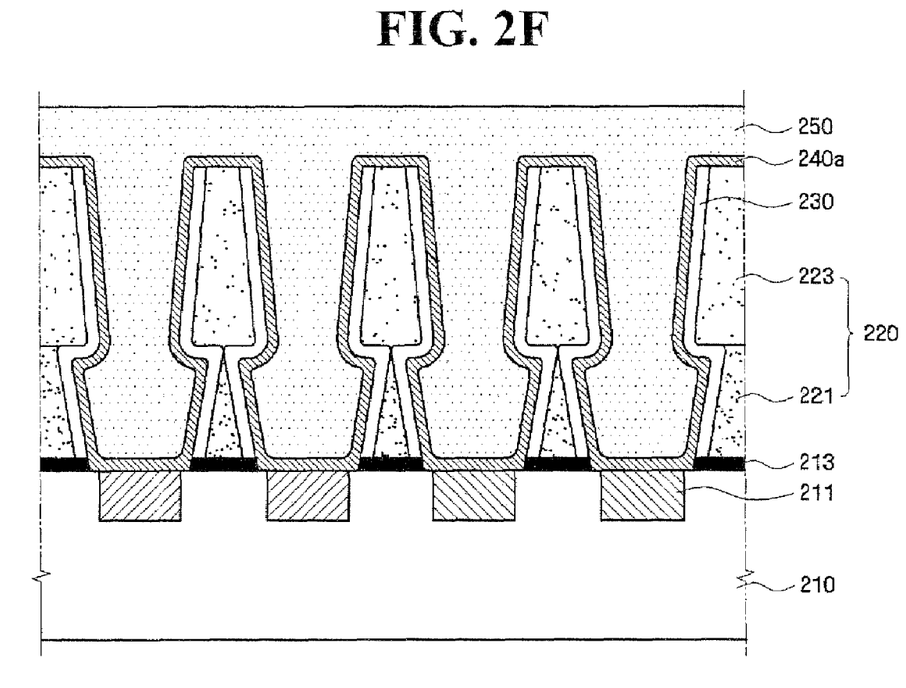

Subsequently, referring to FIG. 2F, a conductive film 240a for a storage electrode is conformally formed on the top surface of the sacrificial spacer 230 and the exposed top surface of the contact plug 211. Next, the inside of the opening 225 is filled so as to form a sacrificial capping film 250 having a higher top surface than the multilayer mold 220.

This process can be implemented in the same manner as that of FIGS. 1F and 1G.

Figure 2G:
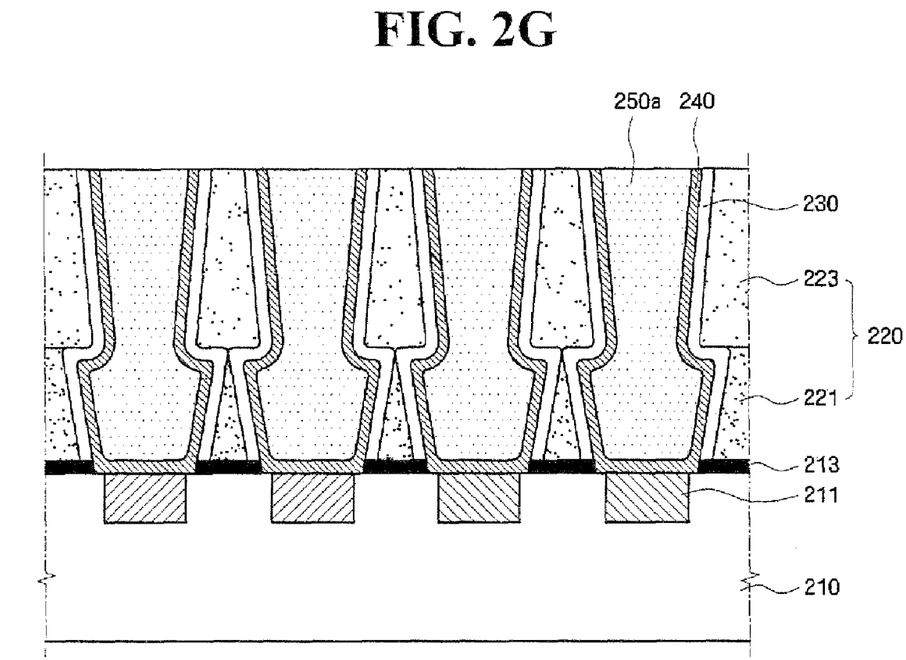

Next, referring to FIG. 2G, the top surface of the multilayer mold 220 is exposed by partially removing the sacrificial capping film 250 and the conductive film 240a so as to separate nodes of the conductive film 240a. As a result, the formation of the storage electrode 240 is completed. This process can be implemented in the same manner as that of FIG. 1H.

Figure 2H:
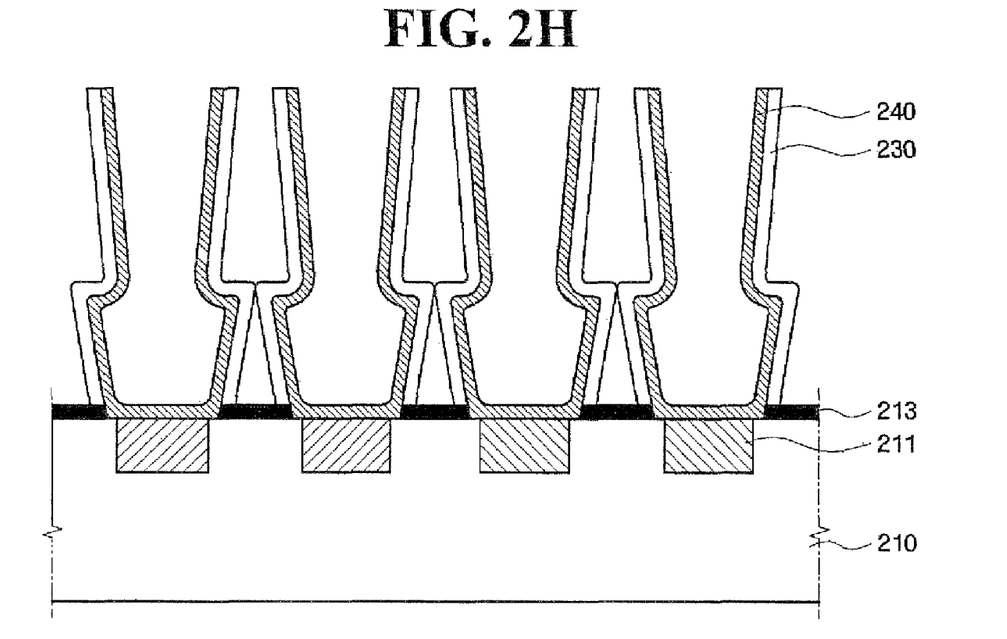

Subsequently, referring to FIG. 2H, the multilayer mold (220 of FIG. 2G) and the sacrificial capping film (250a of FIG. 2G) are removed by a wet etching process. In this case, the sacrificial spacer 230 remains to support the external wall of the storage electrode 240. This process can be implemented in the same manner as that of FIG. 1I.

Figure 2I:
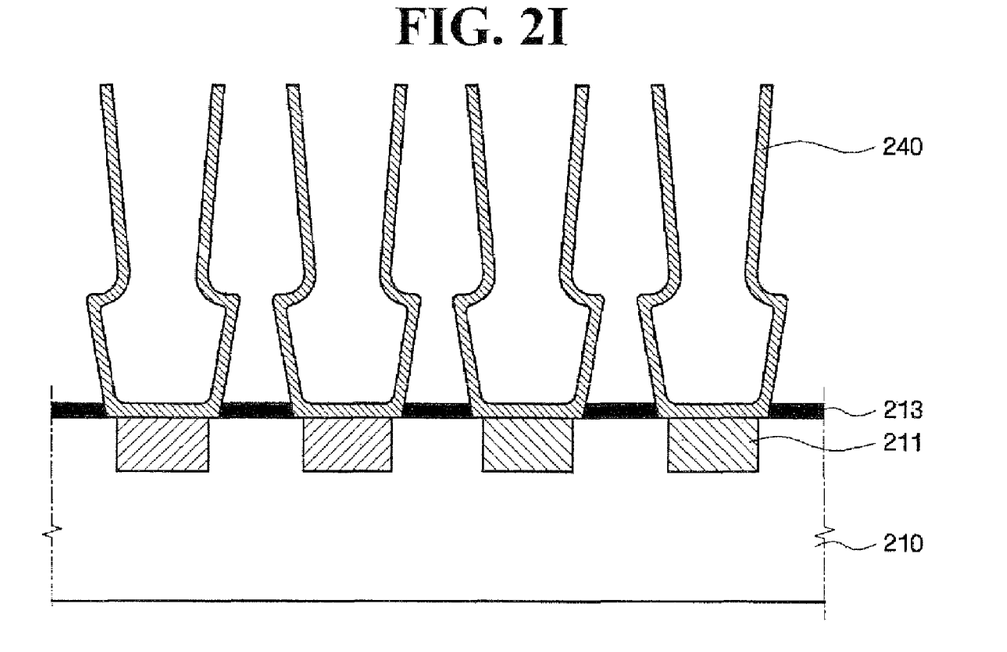

Next, referring to FIG. 2I, the sacrificial spacer (230 of FIG. 2H) is removed by an ashing process or an isotropic dry etching process to expose both side walls of the storage electrode 240. This process can be implemented in the same manner as that of FIG. 1J.

Figure 2J:
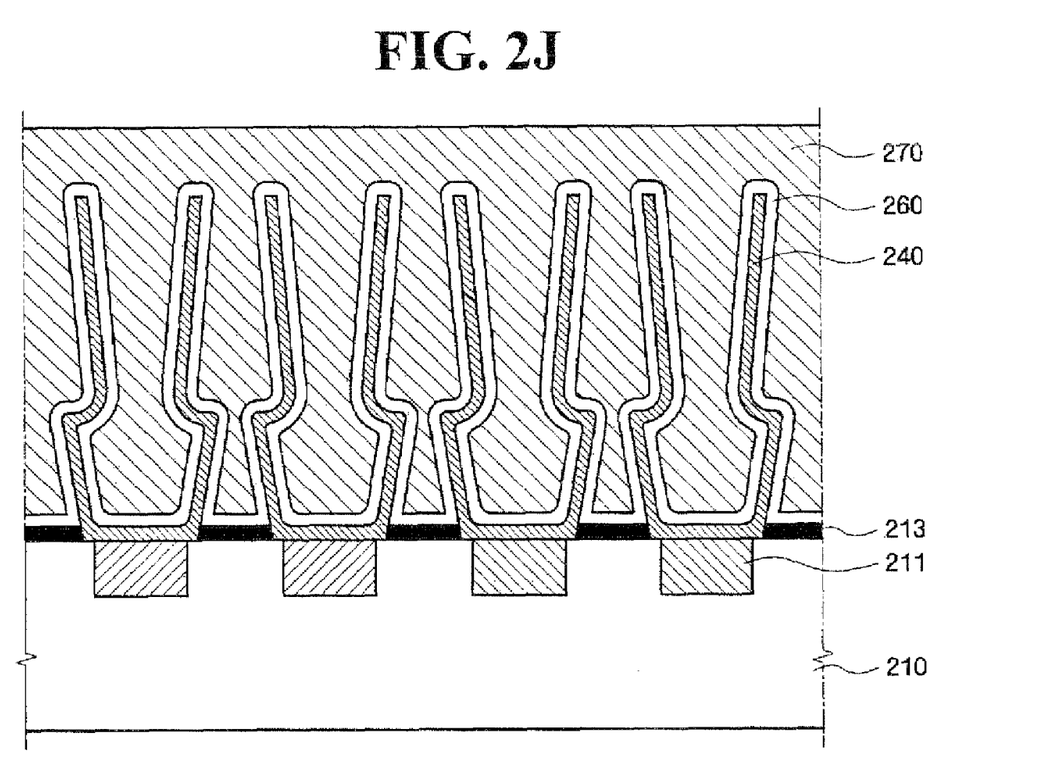

Subsequently, as shown in FIG. 2J, a dielectric film 260 and an upper electrode 270 are sequentially formed on the storage electrode 240. The process can be implemented in the same manner as that of FIG. 1K.

Finally, according to process steps well known to those skilled in the art of semiconductor manufacturing, a step of forming other wiring lines, a process of forming passivation on the substrate, and a step of packaging the substrate are further performed to complete formation of the semiconductor device.

As described above, according to the preferred embodiments of the invention, the sacrificial spacer can support the storage electrode while removing the mold for forming a storage electrode and the sacrificial spacer. In particular, in the case in which the sacrificial spacer is connected to another sacrificial spacer, the supporting effect can be amplified. Therefore, the leaning phenomenon of the storage electrode may decrease even though the mold is removed by a wet etching process, thereby preventing bridges between the electrodes. Moreover, after removing the mold, the sacrificial spacer can be removed by a dry etching process. Thus, the leaning phenomenon of a storage electrode is prevented from occurring. Furthermore, while removing the mold and the sacrificial capping film, the sacrificial spacer exists at the external wall of the storage electrode. Thus, defects of the lower structures due to permeation of etching liquid can be prevented. As a result, characteristics of the semiconductor device can be improved.

Although the present invention has been described in connection with the exemplary embodiments of the present invention with reference to the accompanying drawings, it will be apparent to those skilled in the art that various modifications and changes may be made thereto without departing from the scope and spirit of the invention. Therefore, it should be understood that the above embodiments are not limiting, but instead are illustrative in all aspects.

As described above, according to the method of fabricating a semiconductor device, at least one of the following effects can be obtained.

First, while removing a mold for forming a storage electrode and a sacrificial capping film, the sacrificial spacer can support the storage electrode. Particularly, when a sacrificial spacer is connected to another adjacent sacrificial spacer, the supporting effect can be amplified.

Second, even though the mold for forming a storage electrode and the sacrificial capping film are removed by a wet etching process, the sacrificial spacer remains. Therefore, the leaning phenomenon of the storage electrode may decrease, thereby preventing bridges between the electrodes.

Third, after removing the mold for forming a storage electrode, the sacrificial spacer can be removed by a dry etching process. Therefore, the leaning phenomenon of the storage electrode is prevented from occurring in the process of removing the sacrificial spacer.

Fourth, while removing the mold for forming a storage electrode and the sacrificial capping film, the sacrificial spacer exits at the external wall of the storage electrode. Thus, defects of the lower structures due to permeation of etching liquid can be prevented.

According to an embodiment of the invention, there is provided a method of fabricating a semiconductor device, the method including forming an interlayer insulating film on a substrate, forming a mold insulating film on the interlayer insulating film, forming openings through the mold insulating film so as to form a mold, forming sacrificial spacers on the side walls of the openings, forming a conductive film along the inside of the openings in which the sacrificial spacers are formed, forming sacrificial capping films having a higher top surface than the mold by filling the inside of the openings, completing formation of node-separated storage electrodes by partially removing the sacrificial capping film and the conductive film to expose the top of the mold, removing the mold and the sacrificial capping film, removing the sacrificial spacer using a dry method, and sequentially forming a dielectric film and an upper electrode on the storage electrode.

According to another embodiment of the invention, there is provided a method of fabricating a semiconductor device, the method including forming an interlayer insulating film including contact plugs on a substrate, forming a multilayer mold insulating film on the interlayer insulating film and the contact plugs, the multilayer mold insulating film including a lower insulating film and an upper insulating film, forming a plurality of openings through the multilayer mold insulating film, expanding the openings so as to complete the formation of the multilayer mold such that the openings are expanded more in the lower insulating film than in the upper insulating film, forming sacrificial spacers on the side walls of the expanded openings, conformally forming a conductive film on the sacrificial spacers and the multilayer mold, forming a sacrificial capping film filling the inside of the expanded openings, completing the formation of storage electrodes in which nodes are separated by partially removing the sacrificial capping film and the conductive film, thereby exposing the top of the upper insulating film, removing the multilayer mold and the sacrificial capping film by a wet etching process while allowing the sacrificial spacer to remain, removing the sacrificial spacer by a dry etching process, thereby forming storage electrodes, and sequentially forming a dielectric film and an upper electrode on the storage electrodes.

The embodiments described above are to be considered illustrative, and not restrictive, and the appended claims are intended to cover all such modifications, enhancements, and other embodiments, which fall within the spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A method of fabricating a semiconductor device, the method comprising:
    forming an interlayer insulating film on a substrate;
    forming a mold insulating film on the interlayer insulating film, wherein forming the mold comprises forming contact regions in which at least one of the openings meets another adjacent opening;
    forming openings through the mold insulating film so as to form a mold;
    forming sacrificial spacers on the side walls of the openings;
    forming a conductive film along the inside of the openings in which the sacrificial spacers are formed;
    filling the inside of the openings, thereby forming sacrificial capping films;
    partially removing the sacrificial capping film and the conductive film to expose the top of the mold;
    removing the mold and the sacrificial capping film;
    removing the sacrificial spacer using a dry method, thereby forming storage electrodes; and
    sequentially forming a dielectric film and an upper electrode on the storage electrodes.

2. The method of claim 1, wherein forming the mold further comprises expanding the openings using an isotropic etching process.

3. The method of claim 1, wherein forming the sacrificial spacer comprises forming the sacrificial spacer such that it is connected to another sacrificial spacer in at least one of the contact regions.

4. The method of claim 1, wherein the sacrificial spacer is formed of a material that has a different wet etching rate from the mold and the sacrificial capping film.

5. The method of claim 1, wherein removing the mold comprises selectively removing the mold while allowing the sacrificial spacer to remain.

6. The method of claim 1, wherein removing the mold and the sacrificial capping film comprises using hydrofluoric acid or an HF/NH$_4$F mixture.

7. The method of claim 1, wherein the sacrificial spacer comprises one or more of amorphous carbon, insulating polysilicon and silicon nitride.

8. The method of claim 7, wherein removing the sacrificial spacer comprises an ashing process when the sacrificial spacer comprises amorphous carbon.

9. The method of claim 8, wherein the ashing process is performed in an oxygen atmosphere at a temperature range of 100 to 200° C., at a pressure of below about 10 mTorr.

10. The method of claim 7, wherein removing the sacrificial spacer comprises an isotropic dry etching process when the sacrificial spacer comprises insulating polysilicon or silicon nitride.

11. The method of claim 10, wherein the isotropic dry etching process is performed using CF$_4$/O$_2$ gas, at a temperature range of about 15 to about 70° C. and at a pressure range of about 75 to about 675 mTorr.

12. The method of claim 1, wherein the storage electrodes comprise one or more of Ru, Ir ,Ti, TiN and conductive polysilicon.

13. The method of claim 1, wherein removing the mold and the sacrificial capping film comprises a wet etching process.

14. The method of claim 1, further comprising forming an etch stop layer on the interlayer insulating film and the contact plugs before forming the mold insulating film.

15. The method of claim 14, further comprising removing a portion of the sacrificial spacers disposed on the etch stop layer, thereby exposing a portion of the etch stop layer, and removing the exposed portion of the etch stop layer before forming the conductive film.

16. A method of fabricating a semiconductor device, the method comprising:
forming an interlayer insulating film including contact plugs on a substrate;
forming a multilayer mold insulating film on the interlayer insulating film and the contact plugs, the multilayer mold insulating film including a lower insulating film and an upper insulating film;
forming a plurality of openings through the multilayer mold insulating film;
forming a multilayer mold by expanding the openings, wherein the openings are expanded more in the lower insulating film as compared to the upper insulating film wherein forming the multilayer mold comprises forming contact regions in which at least one of the expanded openings meets another adjacent expanded opening;
forming sacrificial spacers on the side walls of the expanded openings;
conformally forming a conductive film on the sacrificial spacers and the multilayer mold;
forming a sacrificial capping film filling the inside of the expanded openings;
partially removing the sacrificial capping film and the conductive film, thereby exposing the top of the upper insulating film;
removing the multilayer mold and the sacrificial capping film using a wet etching process while allowing the sacrificial spacer to remain;
removing the sacrificial spacer using a dry etching process, thereby forming storage electrodes; and
sequentially forming a dielectric film and an upper electrode on the storage electrodes.

17. The method of claim 16, wherein forming the sacrificial spacers comprises forming at least one of the sacrificial spacers so as to be connected to another adjacent sacrificial spacer in at least one of the contact regions.

18. The method of claim 16, wherein the sacrificial spacer comprises one or more of amorphous carbon, insulating polysilicon and silicon nitride.

19. The method of claim 18, wherein removing the sacrificial spacer includes an ashing process when the sacrificial spacer comprises amorphous carbon.

20. The method of claim 19, wherein the ashing process proceeds in an oxygen atmosphere at a temperature range of about 100 to 200° C. and at a pressure of below about 10 mTorr.

21. The method of claim 18, wherein removing the sacrificial spacer includes an isotropic dry etching process when the sacrificial spacer comprises insulating polysilicon or silicon nitride.

22. The method of claim 21, wherein the isotropic dry etching process is performed using CF$_4$/O$_2$ gas, at a temperature range of 15 to 70° C. and at a pressure range of about 75 to about 675 mTorr.

23. The method of claim 16, wherein the lower insulating film has an etch selectivity with respect to the upper insulating film.

24. The method of claim 23, wherein the lower insulating film is doped with impurities and the upper insulating film is not doped with impurities.

25. The method of claim 16, further comprising forming an etch stop layer on the interlayer insulating film and the contact plugs before forming the multilayer mold insulating film.

26. The method of claim 25, further comprising removing a portion of the sacrificial spacers disposed on the etch stop layer, thereby exposing a portion of the etch stop layer, and removing the exposed portion of the etch stop layer before forming the conductive film.

* * * * *